(12) United States Patent
Kong et al.

(10) Patent No.: US 10,573,223 B2
(45) Date of Patent: Feb. 25, 2020

(54) SCAN DRIVER AND A DISPLAY DEVICE INCLUDING THE SAME

(71) Applicant: SAMSUNG DISPLAY CO., LTD., Yongin-si, Gyeonggi-do (KR)

(72) Inventors: Ji-Hye Kong, Seongnam-si (KR); Ji-Su Na, Yongin-si (KR); Yong-Sung Park, Seoul (KR); Dong-Bum Lee, Suwon-si (KR); In-Ho Choi, Seoul (KR); Young-In Hwang, Suwon-si (KR); Min-Woo Byun, Seongnam-si (KR); Hea-Min Jung, Incheon (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 77 days.

(21) Appl. No.: 15/406,948

(22) Filed: Jan. 16, 2017

(65) Prior Publication Data
US 2017/0206826 A1    Jul. 20, 2017

(30) Foreign Application Priority Data

Jan. 19, 2016  (KR) ......................... 10-2016-0006211

(51) Int. Cl.
*G09G 3/20* (2006.01)
*G09G 3/3266* (2016.01)
*H01L 27/12* (2006.01)

(52) U.S. Cl.
CPC ............ *G09G 3/2092* (2013.01); *G09G 3/20* (2013.01); *G09G 3/3266* (2013.01); *G09G 2300/0809* (2013.01); *G09G 2310/0286* (2013.01); *G09G 2310/0291* (2013.01); *G09G 2310/08* (2013.01); *H01L 27/1214* (2013.01)

(58) Field of Classification Search
CPC .. G09G 3/3266; G09G 3/3674; G09G 3/3677; G09G 3/3681; G09G 3/2092; G09G 2310/0291; G09G 2310/08; G09G 2300/0809; H01L 27/1214
USPC ........................................ 345/98–100, 76–83
See application file for complete search history.

(56) References Cited

U.S. PATENT DOCUMENTS

| 6,215,346 B1* | 4/2001 | Cairns ................ H03K 5/15093 327/259 |
| 2014/0028659 A1* | 1/2014 | Yamazaki ................ G09G 3/36 345/213 |
| 2015/0029082 A1* | 1/2015 | Jeon ........................ G11C 19/28 345/98 |

FOREIGN PATENT DOCUMENTS

KR          1020130055258          5/2013

* cited by examiner

*Primary Examiner* — Jimmy H Nguyen
(74) *Attorney, Agent, or Firm* — F. Chau & Associates, LLC

(57) ABSTRACT

A scan driver includes scan signal outputting circuits, at least one of the scan signal outputting circuits includes a driving circuit and a buffer circuit. The driving circuit includes driving transistors. The driving circuit provides first and second driving signals to first and second driving nodes, respectively by turning on or off the driving transistors in response to clock signals and a scan input signal. The buffer circuit includes buffer transistors. The buffer circuit outputs a scan signal at an output node by turning on or off the buffer transistors in response to the first and second driving signals. The at least one of the scan signal outputting circuits performs a back-biasing voltage applying operation on at least one of the driving transistors and the buffer transistors when the driving transistors and the buffer transistors are turned on or off.

11 Claims, 10 Drawing Sheets

SCAN DRIVER AND A DISPLAY DEVICE INCLUDING THE SAME

CROSS-REFERENCE TO RELATED APPLICATION(S)

This application claims priority under 35 U.S.C. § 119 to Korean Patent Application No. 10-2016-0006211, filed on Jan. 19, 2016 in the Korean Intellectual Property Office (KIPO), the disclosure of which is incorporated by reference herein in its entirety.

TECHNICAL FIELD

Exemplary embodiments of the present inventive concept relate to a display device. More particularly, exemplary embodiments of the present inventive concept relate to a scan driver and a display device including the scan driver.

DESCRIPTION OF THE RELATED ART

In general, a display device includes a display panel, a scan (or gate) driver, a data driver, a timing controller, etc. The scan driver provides a scan (or gate) signal to the display panel via scan-lines (or gate lines). To perform this operation, the scan driver includes scan signal outputting circuits that are connected in cascade form, and each of the scan signal outputting circuits includes oxide thin film transistors. Here, each of the scan signal outputting circuits operates according to the switching operations of its oxide thin film transistors.

Typically, an oxide thin film transistor operates in a depletion mode because it has relatively good reliability when its threshold voltage is negative. In this case, however, a current may flow in the oxide thin film transistor while the oxide thin film transistor is turned off. This may be referred to as an off-current phenomenon. To prevent the off-current phenomenon, a scan driver may store a compensation voltage in an internal capacitor and may apply a voltage, which is lower than an actually applied voltage for circuit-operations by the compensation voltage, to a gate terminal of the oxide thin film transistor. Thus, the scan driver may have a relatively large dead space because a structure of respective scan signal outputting circuits included in the scan driver is complicated.

SUMMARY

According to an exemplary embodiment of the present inventive concept, a scan driver may include a plurality of scan signal outputting circuits. Here, at least one of the scan signal outputting circuits may include a driving circuit including a plurality of driving transistors and configured to provide a first driving signal and a second driving signal to a first driving node and a second driving node, respectively by turning on or off the driving transistors in response to a plurality of clock signals and a scan input signal, and a buffer circuit including a plurality of buffer transistors and configured to output a scan signal at an output node by turning on or off the buffer transistors in response to the first driving signal and the second driving signal. In addition, the at least one of the scan signal outputting circuits may perform a back-biasing voltage applying operation on at least one of the driving transistors and the buffer transistors when the driving transistors and the buffer transistors are turned on or off.

In an exemplary embodiment of the present inventive concept, the driving transistors and the buffer transistors may be n-channel metal-oxide semiconductor (NMOS) oxide thin film transistors.

In an exemplary embodiment of the present inventive concept, the at least one of the scan signal outputting circuits may maintain a threshold voltage of a back-biasing target transistor when the back-biasing target transistor is turned on and may increase the threshold voltage of the back-biasing target transistor when the back-biasing target transistor is turned off, wherein the back-biasing target transistor is a driving transistor or a buffer transistor to which the back-biasing voltage operation is performed.

In an exemplary embodiment of the present inventive concept, a turn-on voltage corresponding to a logic high level of each of the clock signals may be the same as a positive back-biasing voltage, and a turn-off voltage corresponding to a logic low level of each of the clock signals may be higher than a negative back-biasing voltage.

In an exemplary embodiment of the present inventive concept, the at least one of the scan signal outputting circuits may apply the positive back-biasing voltage to the back-biasing target transistor when the turn-on voltage is applied to the back-biasing target transistor and may apply the negative back-biasing voltage to the back-biasing target transistor when the turn-off voltage is applied to the back-biasing target transistor.

In an exemplary embodiment of the present inventive concept, the at least one of the scan signal outputting circuits may decrease a threshold voltage of a back-biasing target transistor when the back-biasing target transistor is turned on and may increase the threshold voltage of the back-biasing target transistor when the back-biasing target transistor is turned off, wherein the back-biasing target transistor is a driving transistor or a buffer transistor to which the back-biasing voltage operation is performed.

In an exemplary embodiment of the present inventive concept, a turn-on voltage corresponding to a logic high level of each of the clock signals may be lower than a positive back-biasing voltage, and a turn-off voltage corresponding to a logic low level of each of the clock signals may be higher than a negative back-biasing voltage.

In an exemplary embodiment of the present inventive concept, the at least one of the scan signal outputting circuits may apply the positive back-biasing voltage to the back-biasing target transistor when the turn-on voltage is applied to the back-biasing target transistor and may apply the negative back-biasing voltage to the back-biasing target transistor when the turn-off voltage is applied to the back-biasing target transistor.

In an exemplary embodiment of the present inventive concept, the scan signal may be a gate signal that is applied to gate-lines included in a display panel.

In an exemplary embodiment of the present inventive concept, the scan signal may be an emission control signal that is applied to emission control-lines included in a display panel.

According to an exemplary embodiment of the present inventive concept, a display device may include a display panel including a plurality of pixel circuits, a data driver configured to provide data signals to the display panel via a plurality of data-lines, a scan driver including a plurality of scan signal outputting circuits that provide scan signals to the display panel via a plurality of scan-lines, and a timing controller configured to control the data driver and the scan driver. Here, at least one of the scan signal outputting circuits may include a driving circuit including a plurality of driving transistors and configured to provide a first driving signal and a second driving signal to a first driving node and a second driving node, respectively by turning on or off the driving transistors in response to a plurality of clock signals and a scan input signal, and a buffer circuit including a plurality of buffer transistors and configured to output the scan signal at an output node by turning on or off the buffer transistors in response to the first driving signal and the second driving signal. In addition, each of the scan signal outputting circuits may perform a back-biasing voltage applying operation on at least one of the driving transistors and the buffer transistors when the driving transistors and the buffer transistors are turned on or off.

In an exemplary embodiment of the present inventive concept, the driving transistors and the buffer transistors may be NMOS oxide thin film transistors.

In an exemplary embodiment of the present inventive concept, each of the scan signal outputting circuits may maintain a threshold voltage of a back-biasing target transistor when the back-biasing target transistor is turned on and may increase the threshold voltage of the back-biasing target transistor when the back-biasing target transistor is turned off, wherein the back-biasing target transistor is a driving transistor or a buffer transistor to which the back-biasing voltage operation is performed.

In an exemplary embodiment of the present inventive concept, a turn-on voltage corresponding to a logic high level of each of the clock signals may be the same as a positive back-biasing voltage, and a turn-off voltage corresponding to a logic low level of each of the clock signals may be higher than a negative back-biasing voltage.

In an exemplary embodiment of the present inventive concept, at least one of the scan signal outputting circuits may apply the positive back-biasing voltage to the back-biasing target transistor when the turn-on voltage is applied to the back-biasing target transistor and may apply the negative back-biasing voltage to the back-biasing target transistor when the turn-off voltage is applied to the back-biasing target transistor.

In an exemplary embodiment of the present inventive concept, at least one of the scan signal outputting circuits may decrease a threshold voltage of a back-biasing target transistor when the back-biasing target transistor is turned on and may increase the threshold voltage of the back-biasing target transistor when the back-biasing target transistor is turned off, wherein the back-biasing target transistor is a driving transistor or a buffer transistor to which the back-biasing voltage operation is performed.

In an exemplary embodiment of the present inventive concept, a turn-on voltage corresponding to a logic high level of each of the clock signals may be lower than a positive back-biasing voltage, and a turn-off voltage corresponding to a logic low level of each of the clock signals may be higher than a negative back-biasing voltage.

In an exemplary embodiment of the present inventive concept, at least one of the scan signal outputting circuits may apply the positive back-biasing voltage to the back-biasing target transistor when the turn-on voltage is applied to the back-biasing target transistor and may apply the negative back-biasing voltage to the back-biasing target transistor when the turn-off voltage is applied to the back-biasing target transistor.

In an exemplary embodiment of the present inventive concept, the scan input signal may correspond to a scan start signal or a previous scan signal.

In an exemplary embodiment of the present inventive concept, a scan driver may include plurality of scan signal outputting circuits, wherein at least one of the scan signal outputting circuits includes: a driving circuit including a plurality of back-biasing transistors, the driving circuit configured to output first and second driving signals; and a buffer circuit including a plurality of back-biasing transistors, the buffer circuit configured to output a scan signal in response to the first and second driving signals, wherein a negative back-biasing voltage may be applied to the back-biasing transistors when the back-biasing transistors are turned off and a positive back-biasing voltage may be applied to the back-biasing transistors when the back-biasing transistors are turned on.

BRIEF DESCRIPTION OF THE DRAWINGS

The above and other features of the present inventive concept will become more apparent by describing in detail exemplary embodiments thereof with reference to the accompanying drawings

DETAILED DESCRIPTION OF THE EMBODIMENTS

Hereinafter, exemplary embodiments of the present inventive concept will be explained in detail with reference to the accompanying drawings.

Figure 1:
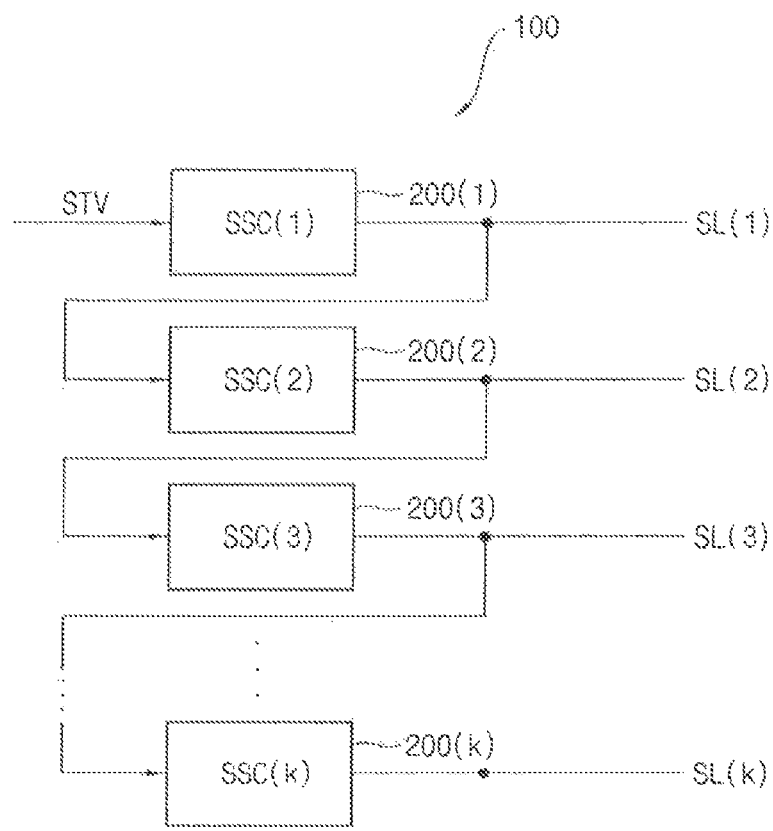
FIG. 1 is a block diagram illustrating a scan driver according to an exemplary embodiment of the present inventive concept.
Figure 2:
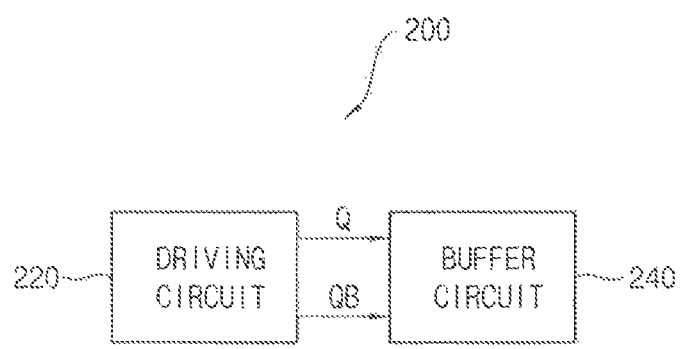
FIG. 2 is a block diagram illustrating a scan signal outputting circuit included in the scan driver of FIG. 1 according to an exemplary embodiment of the present inventive concept.
Figure 3:
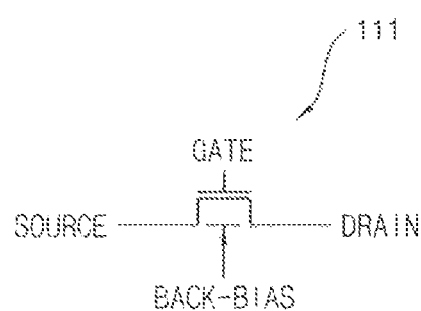
FIG. 3 is a diagram illustrating a back-biasing target transistor included in the scan driver of FIG. 1 according to an exemplary embodiment of the present inventive concept.

FIG. 1 is a block diagram illustrating a scan driver according to an exemplary embodiment of the present inventive concept. FIG. 2 is a block diagram illustrating a scan signal outputting circuit included in the scan driver of FIG. 1 according to an exemplary embodiment of the present inventive concept. FIG. 3 is a diagram illustrating a back-biasing target transistor included in the scan driver of FIG. 1 according to an exemplary embodiment of the present inventive concept.

Referring to FIGS. 1 through 3, a scan driver 100 may include scan signal outputting circuits 200(1) through 200(k), where k is an integer greater than or equal to 2. Here, each of the scan signal outputting circuits 200(1) through 200(k) may include a driving circuit 220 and a buffer circuit 240. The scan signal outputting circuits may also be denoted as SSC(1) to SSC(k).

The scan signal outputting circuits 200(1) through 200(k) of the scan driver 100 may be connected to scan-lines SL(1) through SL(k), respectively. In the scan driver 100, the scan signal outputting circuits 200(1) through 200(k) may be connected in a cascade form. Thus, the scan signal outputting circuits 200(1) through 200(k) may sequentially output a scan signal via the scan-lines SL(1) through SL(k) in response to a scan start signal STV. For example, a second scan signal outputting circuit 200(2) may output the scan signal after a first scan signal outputting circuit 200(1) outputs the scan signal, a third scan signal outputting circuit 200(3) may output the scan signal after the second scan signal outputting circuit 200(2) outputs the scan signal, and a (k)th scan signal outputting circuit 200(k) may output the scan signal after a (k−1)th scan signal outputting circuit 200(k−1) outputs the scan signal.

To perform this operation, as illustrated in FIG. 2, each of the scan signal outputting circuits 200(1) through 200(k) may include the driving circuit 220 and the buffer circuit 240. Each of the driving circuit 220 and the buffer circuit 240 may include oxide thin film transistors. Thus, the driving circuit 220 and the buffer circuit 240 may operate according to switching operations of the oxide thin film transistors. For example, the driving circuit 220 may include driving transistors implemented by the oxide thin film transistors and may provide a first driving signal Q and a second driving signal QB to a first driving node and a second driving node, respectively by turning on or off the driving transistors in response to clock signals and a scan input signal corresponding to a scan start signal STV or a previous scan signal. The buffer circuit 240 may include buffer transistors implemented by the oxide thin film transistors and may output the scan signal at an output node by turning on or off the buffer transistors in response to the first and second driving signals Q and QB provided from the driving circuit 220.

As described above, each of the scan signal outputting circuits 200(1) through 200(k) may operate based on the turn-on and turn-off operations of the oxide thin film transistors. In each of the scan signal outputting circuits 200(1) through 200(k), the driving circuit 220 may be connected to the buffer circuit 240 through the first driving node and the second driving node. In an exemplary embodiment of the present inventive concept, the scan signal outputting circuits 200(1) through 200(k) of the scan driver 100 may be connected in parallel. In this case, the scan signal outputting circuits 200(1) through 200(k) may simultaneously output the scan signals via the scan-lines SL(1) through SL(k) in response to the scan start signal STV.

All or some of the driving transistors (e.g., the oxide thin film transistors) included in the driving circuit 220 may be back-biasing target transistors 111. All or some of the buffer transistors (e.g., the oxide thin film transistors) included in the buffer circuit 240 may be the back-biasing target transistors 111. In general, when an oxide thin film transistor operates in a depletion mode, a current (e.g., which may be referred to as an off-current) may flow in the oxide thin film transistor while the oxide thin film transistor is turned off. If a threshold voltage of the oxide thin film transistor is increased to reduce the off-current, a current (e.g., which may be referred to as an on-current) may be decreased while the oxide thin film transistor is turned on. Thus, each of the scan signal outputting circuits 200(1) through 200(k) may perform a back-biasing voltage applying operation (e.g., indicated by BACK-BIAS) on the driving transistors of the driving circuit 220 and the buffer transistors of the buffer circuit 240. As a result, each of the scan signal outputting circuits 200(1) through 200(k) may decrease the off-current when the driving transistors of the driving circuit 220 and the buffer transistors of the buffer circuit 240 are turned off and may increase (or maintain) the on-current when the driving transistors of the driving circuit 220 and the buffer transistors of the buffer circuit 240 are turned on.

According to requirements of the scan driver 100, it may be unnecessary to perform the back-biasing voltage applying operation on some of the driving transistors included in the driving circuit 220 and some of the buffer transistors included in the buffer circuit 240. Thus, among the driving transistors of the driving circuit 220 and the buffer transistors of the buffer circuit 240, a transistor on which the back-biasing voltage applying operation is performed may be referred to as the back-biasing target transistor 111, and a transistor on which the back-biasing voltage applying operation is not performed may be referred to as a back-biasing non-target transistor. However, all driving transistors included in the driving circuit 220 and all buffer transistors included in the buffer circuit 240 may be the back-biasing target transistors 111.

As described above, the driving transistors of the driving circuit 220 and the buffer transistors of the buffer circuit 240 may be implemented by the oxide thin film transistors. For example, as illustrated in FIG. 3, the driving transistors of the driving circuit 220 and the buffer transistors of the buffer circuit 240 may be n-channel metal oxide semiconductor (NMOS) transistors each having a gate terminal GATE, a source terminal SOURCE, and a drain terminal DRAIN. All or some of the driving transistors included in the driving circuit 220 may be the back-biasing target transistors 111. All or some of the buffer transistors included in the buffer circuit 240 may be the back-biasing target transistors 111. Each of the scan signal outputting circuits 200(1) through 200(k) may perform the back-biasing voltage applying operation (e.g., indicated by BACK-BIAS) on the back-biasing target transistors 111 when the driving transistors of the driving circuit 220 and the buffer transistors of the buffer circuit 240 are turned on or off.

For example, the back-biasing voltage applying operation (e.g., indicated by BACK-BIAS) may be performed on the oxide thin film transistor (e.g., the back-biasing target transistor 111) by applying a back-biasing voltage to a bottom metal layer of the oxide thin film transistor. Thus, in the driving circuit 220 and the buffer circuit 240, when a negative back-biasing voltage is applied to the back-biasing target transistor 111 as the turn-off voltage is applied to the back-biasing target transistor 111 (e.g., as the back-biasing target transistor 111 is turned off), the threshold voltage of the back-biasing target transistor 111 may be increased, and thus, the off-current of the back-biasing target transistor 111 may be decreased. On the other hand, in the driving circuit 220 and the buffer circuit 240, when a positive back-biasing voltage is applied to the back-biasing target transistor 111 as the turn-on voltage is applied to the back-biasing target transistor 111 (e.g., as the back-biasing target transistor 111 is turned on), the threshold voltage of the back-biasing target transistor 111 may be decreased, and thus, the on-current of the back-biasing target transistor 111 may be increased or maintained.

In an exemplary embodiment of the present inventive concept, each of the scan signal outputting circuits 200(1) through 200(k) may maintain the threshold voltage of the back-biasing target transistor 111 (e.g., characteristics of the back-biasing target transistor 111 are not changed) when the back-biasing target transistor 111 is turned on. In addition, each of the scan signal outputting circuits 200(1) through 200(k) may increase the threshold voltage of the back-biasing target transistor 111 (e.g., characteristics of the back-biasing target transistor 111 are changed) when the back-biasing target transistor 111 is turned off. Here, the turn-on voltage of the back-biasing target transistor 111 corresponding to a logic high level of each of the clock signals applied to the gate terminal GATE of the back-biasing target transistor 111 may be the same as the positive back-biasing voltage applied to the bottom metal layer of the back-biasing target transistor 111. In addition, the turn-off voltage of the back-biasing target transistor 111 corresponding to a logic low level of each of the clock signals applied to the gate terminal GATE of the back-biasing target transistor 111 may be higher than the negative back-biasing voltage applied to the bottom metal layer of the back-biasing target transistor 111.

For example, each of the scan signal outputting circuits 200(1) through 200(k) may apply the positive back-biasing voltage to the back-biasing target transistors 111 (e.g., indicated by BACK-BIAS) when the turn-on voltage is applied to the back-biasing target transistors 111 (e.g., when the back-biasing target transistors 111 are turned on). In addition, each of the scan signal outputting circuits 200(1) through 200(k) may apply the negative back-biasing voltage to the back-biasing target transistors 111 (e.g., indicated by BACK-BIAS) when the turn-off voltage is applied to the back-biasing target transistors 111 (e.g., when the back-biasing target transistors 111 are turned off). As a result, the on-current may be maintained when the back-biasing target transistors 111 are turned on, and the off-current may be decreased when the back-biasing target transistors 111 are turned off.

In an exemplary embodiment of the present inventive concept, each of the scan signal outputting circuits 200(1) through 200(k) may decrease the threshold voltage of the back-biasing target transistor 111 when the back-biasing target transistor 111 is turned on and may increase the threshold voltage of the back-biasing target transistor 111 when the back-biasing target transistor 111 is turned off. Here, the turn-on voltage of the back-biasing target transistor 111 corresponding to a logic high level of each of the clock signals applied to the gate terminal GATE of the back-biasing target transistor 111 may be lower than the positive back-biasing voltage applied to the bottom metal layer of the back-biasing target transistor 111. In addition, the turn-off voltage of the back-biasing target transistor 111 corresponding to a logic low level of each of the clock signals applied to the gate terminal GATE of the back-biasing target transistor 111 may be higher than the negative back-biasing voltage applied to the bottom metal layer of the back-biasing target transistor 111.

For example, each of the scan signal outputting circuits 200(1) through 200(k) may apply the positive back-biasing voltage to the back-biasing target transistors 111 (e.g., indicated by BACK-BIAS) when the turn-on voltage is applied to the back-biasing target transistors 111 (e.g., when the back-biasing target transistors 111 are turned on). In addition, each of the scan signal outputting circuits 200(1) through 200(k) may apply the negative back-biasing voltage to the back-biasing target transistors 111 (e.g., indicated by BACK-BIAS) when the turn-off voltage is applied to the back-biasing target transistors 111 (e.g., when the back-biasing target transistors 111 are turned off). As a result, the on-current may be increased (e.g., as compared to a conventional scan driver) when the back-biasing target transistors 111 are turned on, and the off-current may be decreased when the back-biasing target transistors 111 are turned off.

As described above, the scan driver 100 may effectively prevent an off-current phenomenon of oxide thin film transistors included in respective scan signal outputting circuits 200(1) through 200(k) by applying the back-biasing voltage to the back-biasing target transistor 111 (e.g., the oxide thin film transistor) included in the respective scan signal outputting circuits 200(1) through 200(k) (e.g., indicated by BACK-BIAS). For example, the scan driver 100 may apply the negative back-biasing voltage to the back-biasing target transistor 111 (e.g., may increase the threshold voltage of the back-biasing target transistor 111) when the back-biasing target transistor 111 is turned off. In addition, the scan driver 100 may apply the positive back-biasing voltage to the back-biasing target transistor 111 (e.g., may decrease the threshold voltage of the back-biasing target transistor 111) when the back-biasing target transistor is turned on. Here, the scan driver 100 may have a relatively small dead space as compared to a conventional scan driver because a structure of the respective scan signal outputting circuits 200(1) through 200(k) included in the scan driver 100 is simplified by the above operations. In addition, a display device including the scan driver 100 may secure a good operating margin and operating reliability because the scan driver 100 effectively prevents the off-current phenomenon of the oxide thin film transistors included in the respective scan signal outputting circuits 200(1) through 200(k). In an exemplary embodiment of the present inventive concept, the scan driver 100 may be a gate driver that applies a gate signal to gate-lines included in a display panel of the display device. In an exemplary embodiment of the present inventive concept, the scan driver 100 may be an emission driver that applies an emission control signal to emission control-lines included in the display panel of the display device. Although it is described above that the scan driver 100 operates based on a sequential driving technique that sequentially outputs the scan signal, in an exemplary embodiment of the present inventive concept, the scan driver 100 may operate based on a simultaneous driving technique that simultaneously outputs the scan signal.

Figure 4:
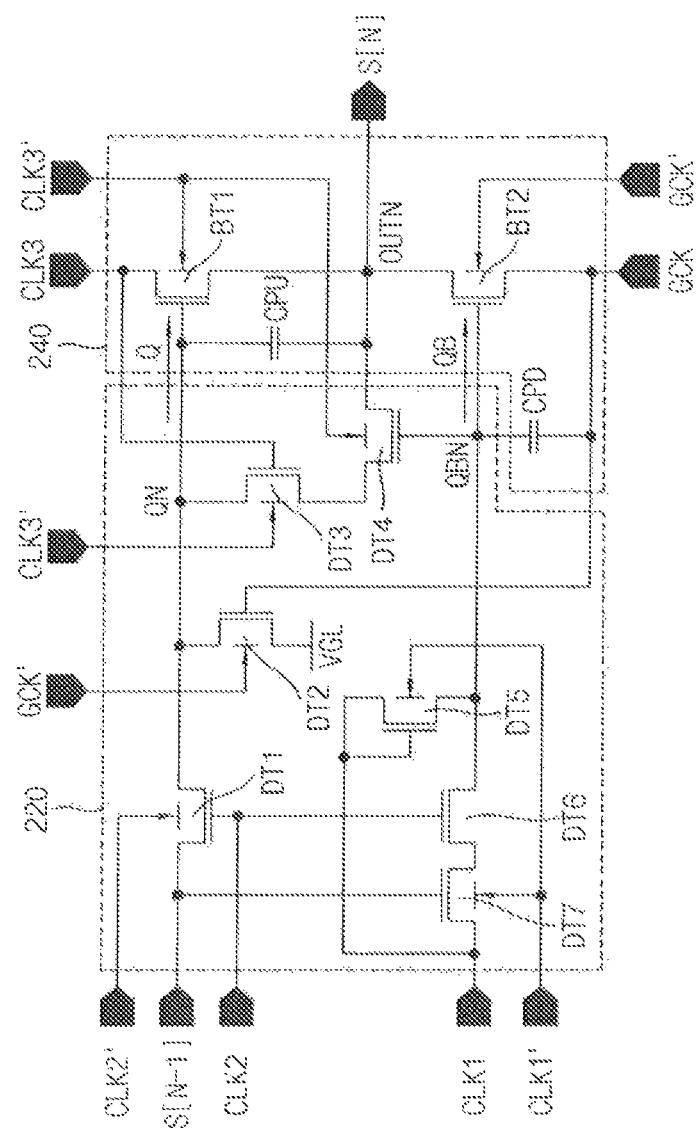
FIG. 4 is a circuit diagram illustrating the scan signal outputting circuit of FIG. 2 according to an exemplary embodiment of the present inventive concept.
Figure 5:
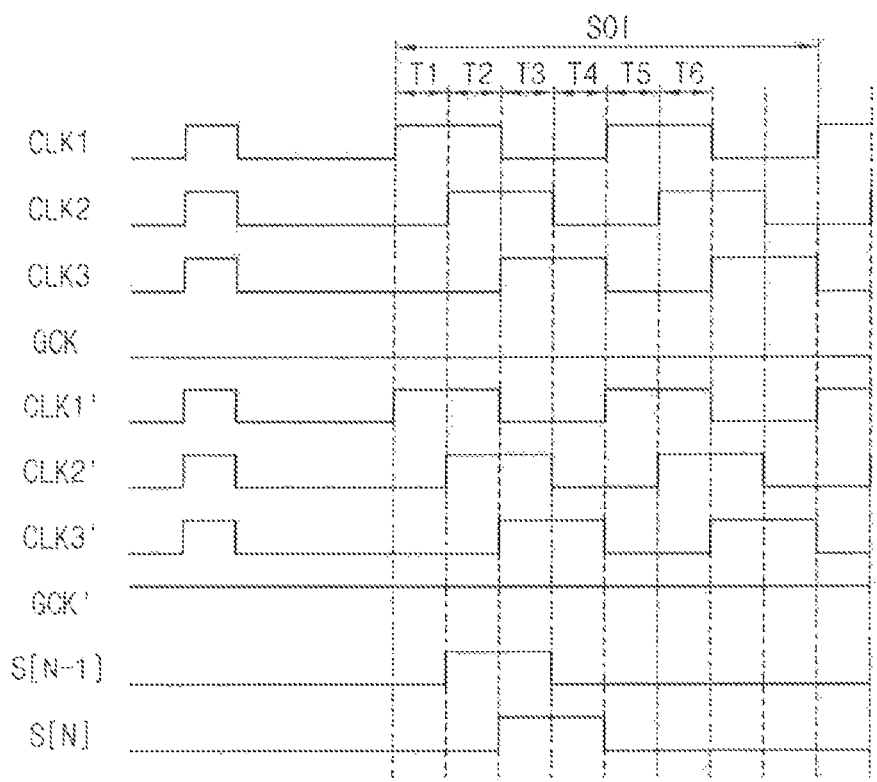
FIG. 5 is a waveform diagram illustrating a case in which the scan signal outputting circuit of FIG. 4 is driven according to an exemplary embodiment of the present inventive concept.
Figure 6:
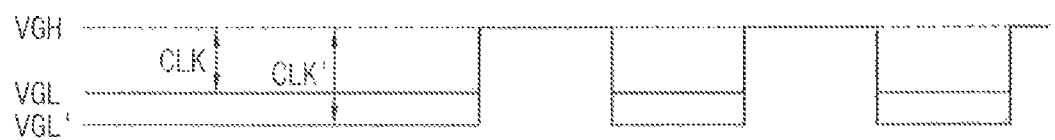
FIG. 6 is a diagram illustrating voltage levels of voltages applied to back-biasing target transistors included in the scan signal outputting circuit of FIG. 4 according to an exemplary embodiment of the present inventive concept.
Figure 7:
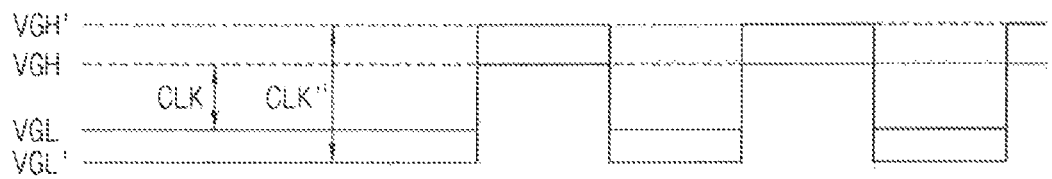
FIG. 7 is a diagram illustrating voltage levels of voltages applied to back-biasing target transistors included in the scan signal outputting circuit of FIG. 4 according to an exemplary embodiment of the present inventive concept.

FIG. 4 is a circuit diagram illustrating the scan signal outputting circuit of FIG. 2 according to an exemplary embodiment of the present inventive concept. FIG. 5 is a waveform diagram illustrating a case in which the scan signal outputting circuit of FIG. 4 is driven according to an exemplary embodiment of the present inventive concept. FIG. 6 is a diagram illustrating voltage levels of voltages applied to back-biasing target transistors included in the scan signal outputting circuit of FIG. 4 according to an exemplary embodiment of the present inventive concept. FIG. 7 is a diagram illustrating voltage levels of voltages applied to back-biasing target transistors included in the scan signal outputting circuit of FIG. 4 according to an exemplary embodiment of the present inventive concept.

Referring to FIGS. 4 through 7, each of the scan signal outputting circuits 200(1) through 200(k) included in the scan driver 100 may include a driving circuit 220 and a buffer circuit 240. In an exemplary embodiment of the present inventive concept, the driving circuit 220 may include a plurality of driving transistors DT1 through DT7, and the buffer circuit 240 may include a plurality of buffer transistors BT1 and BT2. However, the driving circuit 220 may further include other components in addition to the driving transistors DT1 through DT7, and the buffer circuit 240 may further include other components (e.g., capacitors CPU and CPD) in addition to the buffer transistors BT1 and BT2.

For example, the driving circuit 220 may provide a first driving signal Q and a second driving signal QB to a first driving node QN and a second driving node QBN by turning on or off the driving transistors DT1 through DT7 in response to clock signals CLK1, CLK2, CLK3, and GCK and a scan input signal S[N−1] corresponding to a scan start signal or a previous scan signal. In addition, the buffer circuit 240 may output a scan signal S[N] at an output node OUTN by turning on or off the buffer transistors BT1 and BT2 in response to the first driving signal Q and the second driving signal QB. In other words, in each of the scan signal outputting circuits 200(1) through 200(k), the driving circuit 220 may be connected to the buffer circuit 240 through the first driving node QN and the second driving node QBN. Although it is illustrated in FIG. 4 that the scan input signal S[N−1] is the previous scan signal, the scan input signal S[N−1] may be the scan start signal STV input to the first scan signal outputting circuit 200(1).

As described above, each of the scan signal outputting circuits 200(1) through 200(k) may perform a back-biasing voltage applying operation on the back-biasing target transistors of the driving transistors DT1 through DT7 and the buffer transistors BT1 and BT2 when the driving transistors DT1 through DT7 and the buffer transistors BT1 and BT2 are turned on or off. For example, it is illustrated in FIG. 4 that the first driving transistor DT1, the second driving transistor DT2, the third driving transistor DT3, the fourth driving transistor DT4, the fifth driving transistor DT5, the seventh driving transistor DT7, the first buffer transistor BT1, and the second buffer transistor BT2 are the back-biasing target transistors. In other words, it is illustrated in FIG. 4 that the sixth driving transistor DT6 is a back-biasing non-target transistor.

In an operation of each of the scan signal outputting circuits 200(1) through 200(k), the first buffer transistor BT1 may be turned on, and the second buffer transistor BT2 may be turned off when the first driving signal Q provided to the first driving node QN has a logic high level, and the second driving signal QB provided to the second driving node QBN has a logic low level. In this case, the third clock signal CLK3 may be output as the scan signal S[N]. On the other hand, the first buffer transistor BT1 may be turned off, and the second buffer transistor BT2 may be turned on when the first driving signal Q provided to the first driving node QN has a logic low level, and the second driving signal QB provided to the second driving node QBN has a logic high level. In this case, the global clock signal GCK may be output as the scan signal S[N]. As described above, the scan driver 100 (e.g., the scan signal outputting circuits 200(1) through 200(k)) may operate based on a sequential driving technique or a simultaneous driving technique.

For example, when the scan driver 100 operates based on the sequential driving technique, a sequential driving period SOI may include first through sixth periods T1 through T6. During the first period T1, the first clock signal CLK1 may have a logic high level, and the scan input signal S[N−1], the second clock signal CLK2, and the third clock signal CLK3 may have a logic low level. In this case, the first driving signal Q of the first driving node QN may have a logic low level, and the second driving signal QB of the second driving node QBN may have a logic high level. Thus, the scan signal S[N] of the output node OUTN may have a logic low level based on the global clock signal GCK. During the second period T2, the scan input signal S[N−1], the first clock signal CLK1, and the second clock signal CLK2 may have a logic high level, and the third clock signal CLK3 may have a logic low level. In this case, the first driving signal Q of the first driving node QN may have a logic high level, and the second driving signal QB of the second driving node QBN may have a logic high level. Thus, the scan signal S[N] of the output node OUTN may have a logic low level.

During the third period T3, the scan input signal S[N−1], the second clock signal CLK2, and the third clock signal CLK3 may have a logic high level, and the first clock signal CLK1 may have a logic low level. In this case, the first driving signal Q of the first driving node QN may have a logic high level, and the second driving signal QB of the second driving node QBN may have a logic low level. Thus, the scan signal S[N] of the output node OUTN may have a logic high level. In other words, since the first buffer transistor BT1 is turned on in the third period T3, the scan signal S[N] of the output node OUTN may have a logic high level based on the third clock signal CLK3. During the fourth period T4, the third clock signal CLK3 may have a logic high level, and the scan input signal S[N−1], the first clock signal CLK1, and the second clock signal CLK2 may have a logic low level. In this case, the first driving signal Q of the first driving node QN may have a logic high level, and the second driving signal QB of the second driving node QBN may have a logic low level. Thus, the scan signal S[N] of the output node OUTN may have a logic high level. In other words, since the first buffer transistor BT1 is turned on in the fourth period T4, the scan signal S[N] of the output node OUTN may have a logic high level based on the third clock signal CLK3.

During the fifth period T5, the first clock signal CLK1 may have a logic high level, and the scan input signal S[N−1], the second clock signal CLK2, and the third clock signal CLK3 may have a logic low level. In this case, the first driving signal Q of the first driving node QN may have a logic low level, and the second driving signal QB of the second driving node QBN may have a logic high level. Thus, the scan signal S[N] of the output node OUTN may have a logic low level. During the sixth period T6, the first clock signal CLK1 and the second clock signal CLK2 may have a logic high level, and the scan input signal S[N−1] and the third clock signal CLK3 may have a logic low level. In this case, the first driving signal Q of the first driving node QN may have a logic low level, and the second driving signal QB of the second driving node QBN may have a logic high level. Thus, the scan signal S[N] of the output node OUTN may have a logic low level.

Since each of the scan signal outputting circuits 200(1) through 200(k) included in the scan driver 100 includes the second driving transistor DT2 of the driving circuit 220, the scan driver 100 may also operate based on the simultaneous driving technique. For example, when each of the scan signal outputting circuits 200(1) through 200(k) included in the scan driver 100 operates based on the simultaneous driving technique, the first clock signal CLK1, the second clock signal CLK2, and the third clock signal CLK3 may have a logic low level, and the scan input signal S[N−1] and the global clock signal GCK may have a logic high level during a simultaneous driving period. In this case, the first driving signal Q of the first driving node QN may have a logic low level (e.g., VGL), and the second driving signal QB of the second driving node QBN may have a logic high level. Thus, the scan signal S[N] of the output node OUTN may have a logic high level (e.g., VGH) based on the global clock signal GCK. As described above, each of the scan signal outputting circuits 200(1) through 200(k) included in the scan driver 100 may operate by turning on or off the driving transistors DT1 through DT7 and the buffer transistors BT1 and BT2 based on the scan input signal S[N−1] and the clock signals CLK1, CLK2, CLK3, and GCK.

As illustrated in FIGS. 4 and 5, the scan input signal S[N−1] and the clock signals CLK1, CLK2, CLK3, and GCK are applied to the driving transistors DT1 through DT7 and the buffer transistors BT1 and BT2, the back-biasing voltages CLK1', CLK2', CLK3', and GCK' may be applied to the back-biasing target transistors DT1, DT2, DT3, DT4, DT5, DT7, BT1, and BT2. As a result, in each of the scan signal outputting circuits 200(1) through 200(k) included in the scan driver 100, the threshold voltages of the back-biasing target transistors DT1, DT2, DT3, DT4, DT5, DT7, BT1, and BT2 may be maintained or decreased when the back-biasing target transistors DT1, DT2, DT3, DT4, DT5, DT7, BT1, and BT2 are turned on, and the threshold voltages of the back-biasing target transistors DT1, DT2, DT3, DT4, DT5, DT7, BT1, and BT2 may be increased when the back-biasing target transistors DT1, DT2, DT3, DT4, DT5, DT7, BT1, and BT2 are turned off. In other words, in each of the scan signal outputting circuits 200(1) through 200(k) included in the scan driver 100, the on-current of the back-biasing target transistors DT1, DT2, DT3, DT4, DT5, DT7, BT1, and BT2 may be maintained or increased when the back-biasing target transistors DT1, DT2, DT3, DT4, DT5, DT7, BT1, and BT2 are turned on, and the off-current of the back-biasing target transistors DT1, DT2, DT3, DT4, DT5, DT7, BT1, and BT2 may be decreased when the back-biasing target transistors DT1, DT2, DT3, DT4, DT5, DT7, BT1, and BT2 are turned off.

In an exemplary embodiment of the present inventive concept, as illustrated in FIG. 6, a turn-on voltage (e.g., indicated by VGH of CLK) of the back-biasing target transistors DT1, DT2, DT3, DT4, DT5, DT7, BT1, and BT2 corresponding to a logic high level of the clock signal CLK applied to the back-biasing target transistors DT1, DT2, DT3, DT4, DT5, DT7, BT1, and BT2 may be the same as the positive back-biasing voltage (e.g., indicated by VGH of CLK') applied to the back-biasing target transistors DT1, DT2, DT3, DT4, DT5, DT7, BT1, and BT2. In addition, a turn-off voltage (e.g., indicated by VGL of CLK) of the back-biasing target transistors DT1, DT2, DT3, DT4, DT5, DT7, BT1, and BT2 corresponding to a logic low level of the clock signal CLK applied to the back-biasing target transistors DT1, DT2, DT3, DT4, DT5, DT7, BT1, and BT2 may be higher than the negative back-biasing voltage (e.g., indicated by VGL' of CLK') applied to the back-biasing target transistors DT1, DT2, DT3, DT4, DT5, DT7, BT1, and BT2.

In an exemplary embodiment of the present inventive concept, as illustrated in FIG. 7, a turn-on voltage (e.g., indicated by VGH of CLK) of the back-biasing target transistors DT1, DT2, DT3, DT4, DT5, DT7, BT1, and BT2 corresponding to a logic high level of the clock signal CLK applied to the back-biasing target transistors DT1, DT2, DT3, DT4, DT5, DT7, BT1, and BT2 may be lower than the positive back-biasing voltage (e.g., indicated by VGH' of CLK") applied to the back-biasing target transistors DT1, DT2, DT3, DT4, DT5, DT7, BT1, and BT2. In addition, a turn-off voltage (e.g., indicated by VGL of CLK) of the back-biasing target transistors DT1, DT2, DT3, DT4, DT5, DT7, BT1, and BT2 corresponding to a logic low level of the clock signal CLK applied to the back-biasing target transistors DT1, DT2, DT3, DT4, DT5, DT7, BT1, and BT2 may be higher than the negative back-biasing voltage (e.g., indicated by VGL' of CLK") applied to the back-biasing target transistors DT1, DT2, DT3, DT4, DT5, DT7, BT1, and BT2. Since a structure shown in FIG. 4 is an example, each of the scan signal outputting circuits 200(1) through 200(k) included in the scan driver 100 is not limited thereto.

Figure 8:
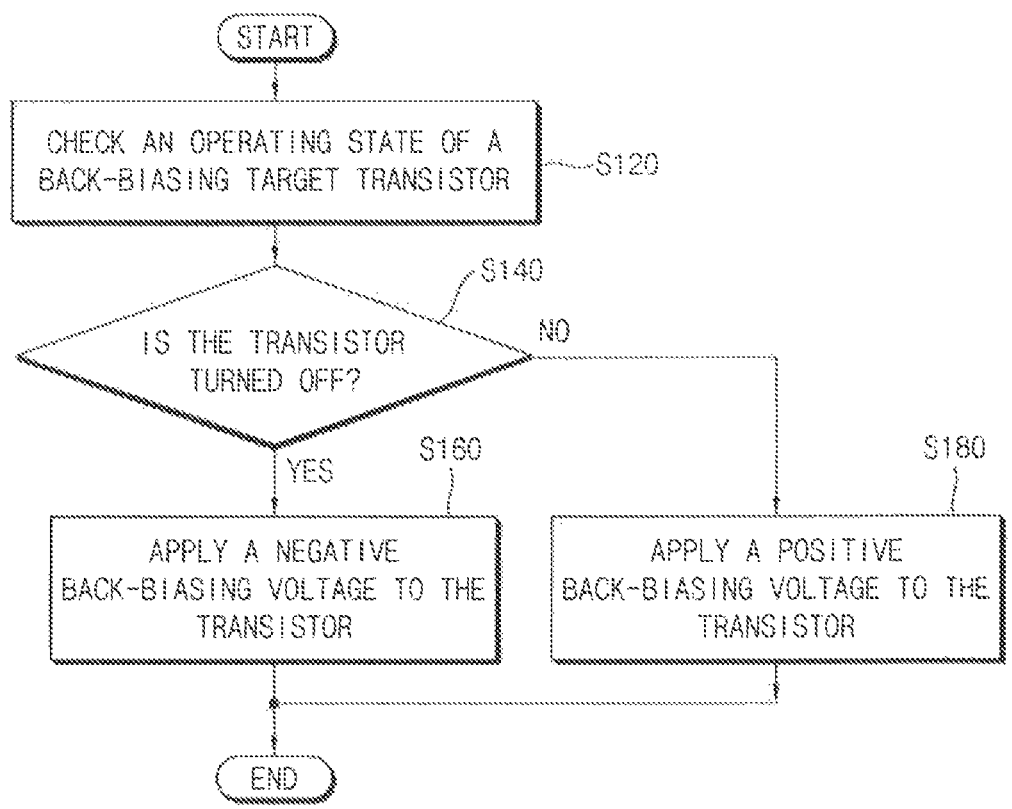
FIG. 8 is a flowchart illustrating a process in which a back-biasing target transistor included in a scan signal outputting circuit is controlled by the scan driver of FIG. 1 according to an exemplary embodiment of the present inventive concept.
Figure 9:
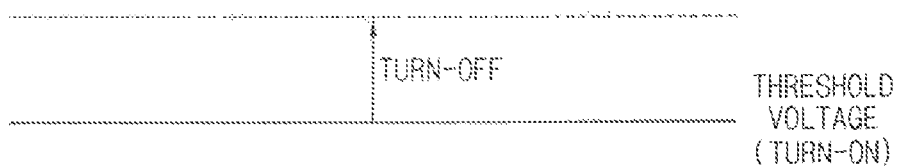
FIG. 9 is a diagram illustrating a case in which a threshold voltage of a back-biasing target transistor is changed by the scan driver of FIG. 1 according to an exemplary embodiment of the present inventive concept.
Figure 10:
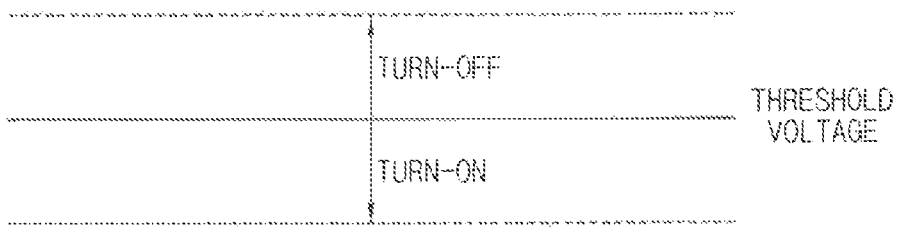
FIG. 10 is a diagram illustrating a case in which a threshold voltage of a back-biasing target transistor is changed by the scan driver of FIG. 1 according to an exemplary embodiment of the present inventive concept.

FIG. 8 is a flowchart illustrating a process in which a back-biasing target transistor included in a scan signal outputting circuit is controlled by the scan driver of FIG. 1 according to an exemplary embodiment of the present inventive concept. FIG. 9 is a diagram illustrating a case in which a threshold voltage of a back-biasing target transistor is changed by the scan driver of FIG. 1 according to an exemplary embodiment of the present inventive concept. FIG. 10 is a diagram illustrating a case in which a threshold voltage of a back-biasing target transistor is changed by the scan driver of FIG. 1 according to an exemplary embodiment of the present inventive concept.

Referring to FIGS. 8 through 10, the scan driver 100 may check an operating state of a back-biasing target transistor 111 in each of the scan signal outputting circuits 200(1) through 200(k) (S120). In addition, the scan driver 100 may check whether the back-biasing target transistor 111 is turned off in each of the scan signal outputting circuits 200(1) through 200(k) (S140). When the back-biasing target transistor 111 is turned off in each of the scan signal outputting circuits 200(1) through 200(k), the scan driver 100 may apply a negative back-biasing voltage to the back-biasing target transistor 111 in each of the scan signal outputting circuits 200(1) through 200(k) (S160). Thus, as illustrated in FIGS. 9 and 10, a threshold voltage of the back-biasing target transistor 111 may be increased (e.g., indicated by TURN-OFF), and thus, an off-current of the back-biasing target transistor 111 may be decreased in each of the scan signal outputting circuits 200(1) through 200(k). On the other hand, when the back-biasing target transistor 111 is not turned off (in other words, turned on) in each of the scan signal outputting circuits 200(1) through 200(k), the scan driver 100 may apply a positive back-biasing voltage to the back-biasing target transistor 111 in each of the scan signal outputting circuits 200(1) through 200(k) (S180).

In an exemplary embodiment of the present inventive concept, as illustrated in FIG. 9, when a turn-on voltage applied to the back-biasing target transistor 111 is the same as the positive back-biasing voltage applied to the back-biasing target transistor 111 in each of the scan signal outputting circuits 200(1) through 200(k), the threshold voltage of the back-biasing target transistor 111 may be maintained (e.g., indicated by TURN-ON), and thus, an on-current of the back-biasing target transistor 111 may be maintained in each of the scan signal outputting circuits 200(1) through 200(k). In an embodiment of the present inventive concept, as illustrated in FIG. 10, when the turn-on voltage applied to the back-biasing target transistor 111 is lower than the positive back-biasing voltage applied to the back-biasing target transistor 111 in each of the scan signal outputting circuits 200(1) through 200(k), the threshold voltage of the back-biasing target transistor 111 may be decreased (e.g., indicated by TURN-ON), and thus, the on-current of the back-biasing target transistor 111 may be increased in each of the scan signal outputting circuits 200(1) through 200(k).

In brief, as the scan driver 100 performs a back-biasing voltage applying operation on the back-biasing target transistor 111 in each of the scan signal outputting circuits 200(1) through 200(k), the scan driver 100 may decrease the off-current of the back-biasing target transistor 111 when the back-biasing target transistor 111 is turned off, and may maintain or increase the on-current of the back-biasing target transistor 111 when the back-biasing target transistor 111 is turned on. Accordingly, the scan driver 100 may effectively prevent an off-current phenomenon of oxide thin film transistors included in each of the scan signal outputting circuits 200(1) through 200(k).

Figure 11:
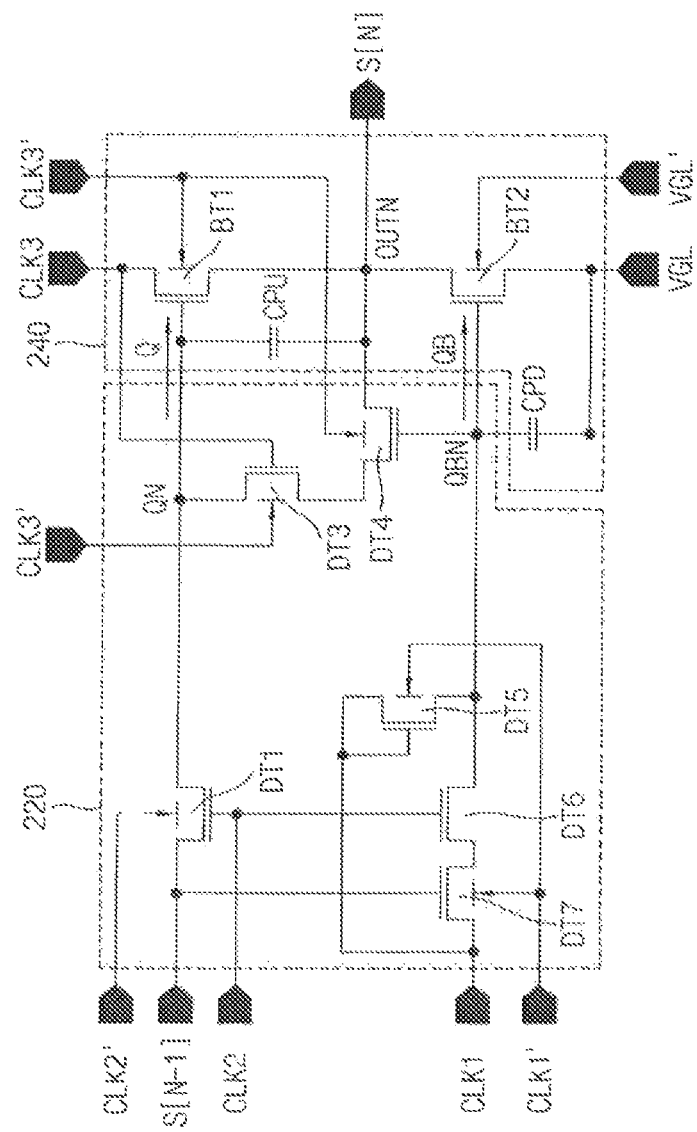
FIG. 11 is a circuit diagram illustrating the scan signal outputting circuit of FIG. 2 according to an exemplary embodiment of the present inventive concept.

FIG. 11 is a circuit diagram illustrating the scan signal outputting circuit of FIG. 2 according to an exemplary embodiment of the present inventive concept.

Referring to FIG. 11, each of the scan signal outputting circuits 200(1) through 200(k) included in the scan driver 100 may include a driving circuit 220 and a buffer circuit 240. In an exemplary embodiment of the present inventive concept, the driving circuit 220 may include a plurality of driving transistors DT1, DT3, DT4, DT5, DT6, and DT7, and the buffer circuit 240 may include a plurality of buffer transistors BT1 and BT2. However, the driving circuit 220 may further include other components in addition to the driving transistors DT1, DT3, DT4, DT5, DT6, and DT7, and the buffer circuit 240 may further include other components (e.g., capacitors CPU and CPD) in addition to the buffer transistors BT1 and BT2. The structure illustrated in FIG. 11 is the same as the structure illustrated in FIG. 4 except that the driving circuit 220 does not include the second driving transistor DT2 in FIG. 11. Thus, since each of the scan signal outputting circuits 200(1) through 200(k) included in the scan driver 100 does not include the second driving transistor DT2 of the driving circuit 220, the scan driver 100 may operate only based on a sequential driving technique. In other words, the scan driver 100 may not operate based on a simultaneous driving technique. For this reason, in the structure illustrated in FIG. 11, a fixed voltage VGL having a logic low level instead of a global clock signal GCK may be applied to a terminal of the second buffer transistor BT2 included in the buffer circuit 240.

Since a sequential driving operation of the structure illustrated in FIG. 11 is the same as a sequential driving operation of the structure illustrated in FIG. 4, a duplicate description will not be repeated. As illustrated in FIG. 11, the first driving transistor DT1, the third driving transistor DT3, the fourth driving transistor DT4, the fifth driving transistor DT5, and the seventh driving transistor DT7 may be the back-biasing target transistors, and the sixth driving transistor DT6 may be a back-biasing non-target transistor. In addition, the first buffer transistor BT1 and the second buffer transistor BT2 may be the back-biasing target transistors.

Each of the scan signal outputting circuits 200(1) through 200(k) included in the scan driver 100 may operate by turning on or off the driving transistors DT1, DT3, DT4, DT5, DT6, and DT7 and the buffer transistors BT1 and BT2 based on a scan input signal S[N−1] and clock signals CLK1, CLK2, and CLK3. In other words, when the scan input signal S[N−1] and the clock signals CLK1, CLK2, and CLK3 are applied to the driving transistors DT1, DT3, DT4, DT5, DT6, and DT7 and the buffer transistors BT1 and BT2, the back-biasing voltages CLK1', CLK2', CLK3', and VGL' may be applied to the back-biasing target transistors DT1, DT3, DT4, DT5, DT7, BT1, and BT2.

As a result, in each of the scan signal outputting circuits 200(1) through 200(k) included in the scan driver 100, the threshold voltages of the back-biasing target transistors DT1, DT3, DT4, DT5, DT7, BT1, and BT2 may be maintained or decreased when the back-biasing target transistors DT1, DT3, DT4, DT5, DT7, BT1, and BT2 are turned on. In addition, the threshold voltages of the back-biasing target transistors DT1, DT3, DT4, DT5, DT7, BT1, and BT2 may be increased when the back-biasing target transistors DT1, DT3, DT4, DT5, DT7, BT1, and BT2 are turned off. In other words, in each of the scan signal outputting circuits 200(1) through 200(k) included in the scan driver 100, the on-current of the back-biasing target transistors DT1, DT3, DT4, DT5, DT7, BT1, and BT2 may be maintained or increased when the back-biasing target transistors DT1, DT3, DT4, DT5, DT7, BT1, and BT2 are turned on. In addition, the off-current of the back-biasing target transistors DT1, DT3, DT4, DT5, DT7, BT1, and BT2 may be decreased when the back-biasing target transistors DT1, DT3, DT4, DT5, DT7, BT1, and BT2 are turned off.

In an exemplary embodiment of the present inventive concept, a turn-on voltage of the back-biasing target transistors DT1, DT3, DT4, DT5, DT7, BT1, and BT2 corresponding to a logic high level of the clock signal CLK applied to the back-biasing target transistors DT1, DT3, DT4, DT5, DT7, BT1, and BT2 may be the same as the positive back-biasing voltage applied to the back-biasing target transistors DT1, DT3, DT4, DT5, DT7, BT1, and BT2. In addition, a turn-off voltage of the back-biasing target transistors DT1, DT3, DT4, DT5, DT7, BT1, and BT2 corresponding to a logic low level of the clock signal CLK applied to the back-biasing target transistors DT1, DT3, DT4, DT5, DT7, BT1, and BT2 may be higher than the negative back-biasing voltage applied to the back-biasing target transistors DT1, DT3, DT4, DT5, DT7, BT1, and BT2. In an exemplary embodiment of the present inventive concept, a turn-on voltage of the back-biasing target transistors DT1, DT3, DT4, DT5, DT7, BT1, and BT2 corresponding to a logic high level of the clock signal CLK applied to the back-biasing target transistors DT1, DT3, DT4, DT5, DT7, BT1, and BT2 may be lower than the positive back-biasing voltage applied to the back-biasing target transistors DT1, DT3, DT4, DT5, DT7, BT1, and BT2. In addition, a turn-off voltage of the back-biasing target transistors DT1, DT3, DT4, DT5, DT7, BT1, and BT2 corresponding to a logic low level of the clock signal CLK applied to the back-biasing target transistors DT1, DT3, DT4, DT5, DT7, BT1, and BT2 may be higher than the negative back-biasing voltage applied to the back-biasing target transistors DT1, DT3, DT4, DT5, DT7, BT1, and BT2. Since the structure shown in FIG. 11 is an example, each of the scan signal outputting circuits 200(1) through 200(k) included in the scan driver 100 is not limited thereto.

Figure 12:
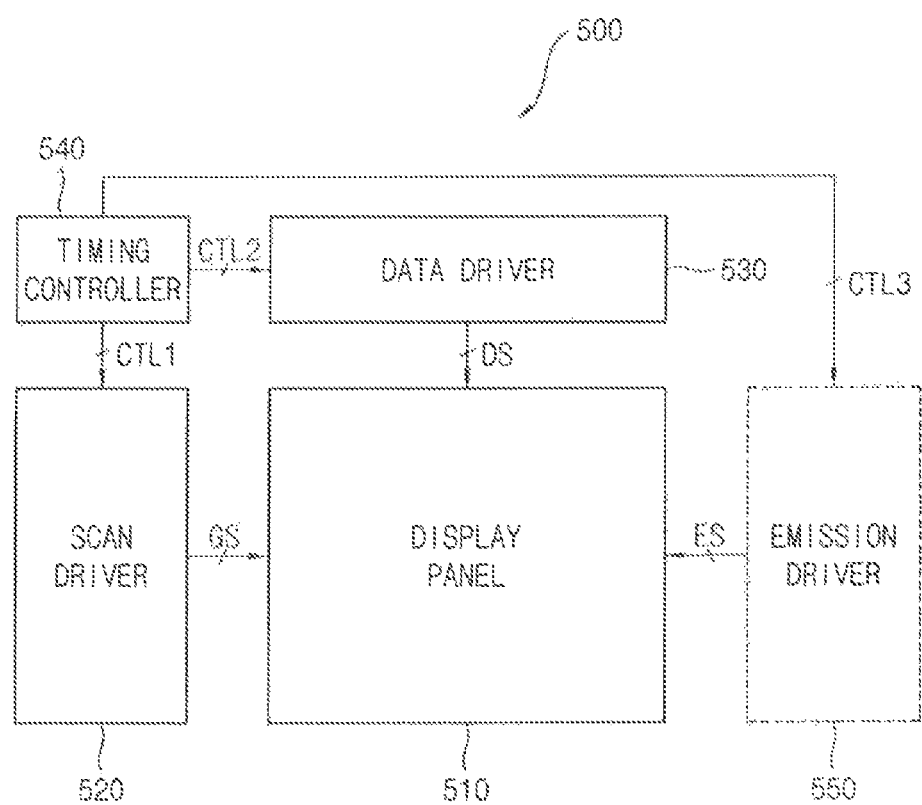
FIG. 12 is a block diagram illustrating a display device according to an exemplary embodiment of the present inventive concept.

FIG. 12 is a block diagram illustrating a display device according to an exemplary embodiment of the present inventive concept.

Referring to FIG. 12, a display device 500 may include a display panel 510, a scan driver 520, a data driver 530, and a timing controller 540. It is illustrated in FIG. 12 that the scan driver 520 is a gate driver that provides a gate signal GS to the display panel 510 via gate-lines. In an exemplary embodiment of the present inventive concept, when a pixel circuit included in the display panel 510 requires an emission control signal ES, the display device 500 may further include an emission driver 550 that provides the emission control signal ES to the display panel 510 via emission control-lines. Here, a structure of the emission driver 550 may be substantially the same as a structure of the scan driver 520. In an exemplary embodiment of the present inventive concept, the display device 500 may be an organic light emitting display (OLED) device or a liquid crystal display (LCD) device. However, the display device 500 is not limited thereto.

The display panel 510 may include a plurality of pixel circuits. The display panel 510 may be connected to the scan driver 520 via scan-lines (also referred to as gate lines). The display panel 510 may be connected to the data driver 530 via data-lines. In an exemplary embodiment of the present inventive concept, the display panel 510 may be connected to the emission driver 550 via the emission control-lines. The scan driver 520 may provide the scan signal GS to the display panel 510 via the scan-lines. The data driver 530 may provide the data signal DS to the display panel 510 via the data-lines. The emission driver 550 may provide the emission control signal ES to the display panel 510 via the emission control-lines. The timing controller 540 may generate driving control signals CTL1 and CTL2 to control the scan driver 520 and the data driver 530. In an exemplary embodiment of the present inventive concept, when the display device 500 includes the emission driver 550, the timing controller 540 may generate a driving control signal CTL3 to be provided to the emission driver 550 and may control the emission driver 550 based on the driving control signal CTL3. The timing controller 540 may receive image data and may provide processed image data to the data driver 530 by performing a specific data processing on the image data (e.g., degradation compensation, image processing, etc).

The scan driver 520 may include a plurality of scan signal outputting circuits. Each of the scan signal outputting circuits may include a driving circuit and a buffer circuit each including oxide thin film transistors. Thus, each of the scan signal outputting circuits operates according to switching operations of the oxide thin film transistors. For example, the driving circuit may include driving transistors that are implemented by the oxide thin film transistors. The driving circuit may provide a first driving signal and a second driving signal to a first driving node and a second driving node, respectively by turning on or off the driving transistors in response to clock signals and a scan input signal corresponding to a scan start signal or a previous scan signal. The buffer circuit may include buffer transistors that are implemented by the oxide thin film transistors. The buffer circuit may output a scan signal at an output node by turning on or off the buffer transistors in response to the first and second driving signals provided from the driving circuit.

For example, each of the scan signal outputting circuits included in the scan driver 520 may perform a back-biasing voltage applying operation on back-biasing target transistors among the driving transistors of the driving circuit and the buffer transistors of the buffer circuit when the driving transistors of the driving circuit and the buffer transistors of the buffer circuit are turned on or off. In other words, in each of the scan signal outputting circuits included in the scan driver 520, the performance of the back-biasing voltage applying operation on the driving transistors of the driving circuit and the buffer transistors of the buffer circuit, may decrease an off-current of the driving transistors of the driving circuit and the buffer transistors of the buffer circuit when the driving transistors of the driving circuit and the buffer transistors of the buffer circuit are turned off. In addition, in each of the scan signal outputting circuits included in the scan driver 520, the performance of the back-biasing voltage applying operation on the driving transistors of the driving circuit and the buffer transistors of the buffer circuit, may increase (or maintain) an on-current of the driving transistors of the driving circuit and the buffer transistors of the buffer circuit when the driving transistors of the driving circuit and the buffer transistors of the buffer circuit are turned on. For example, the driving transistors of the driving circuit and the buffer transistors of the buffer circuit may be NMOS transistors of the oxide thin film transistors, and some or all of the driving transistors of the driving circuit and the buffer transistors of the buffer circuit may be the back-biasing target transistors.

In an exemplary embodiment of the present inventive concept, each of the scan signal outputting circuits included in the scan driver 520 may maintain the threshold voltage of the back-biasing target transistor when the back-biasing target transistor is turned on and may increase the threshold voltage of the back-biasing target transistor when the back-biasing target transistor is turned off. Here, a turn-on voltage of the back-biasing target transistor corresponding to a logic high level of each of the clock signals applied to the back-biasing target transistor may be the same as the positive back-biasing voltage applied to the back-biasing target transistor. In addition, a turn-off voltage of the back-biasing target transistor corresponding to a logic low level of each of the clock signals applied to the back-biasing target transistor may be higher than the negative back-biasing voltage applied to the back-biasing target transistor. For example, each of the scan signal outputting circuits included in the scan driver 520 may apply the positive back-biasing voltage to the back-biasing target transistor when the turn-on voltage is applied to the back-biasing target transistor and may apply the negative back-biasing voltage to the back-biasing target transistor when the turn-off voltage is applied to the back-biasing target transistor.

In an exemplary embodiment of the present inventive concept, each of the scan signal outputting circuits included in the scan driver 520 may decrease the threshold voltage of the back-biasing target transistor when the back-biasing target transistor is turned on and may increase the threshold voltage of the back-biasing target transistor when the back-biasing target transistor is turned off. Here, a turn-on voltage of the back-biasing target transistor corresponding to a logic high level of each of the clock signals applied to the back-biasing target transistor may be lower than the positive back-biasing voltage applied to the back-biasing target transistor. In addition, a turn-off voltage of the back-biasing target transistor corresponding to a logic low level of each of the clock signals applied to the back-biasing target transistor may be higher than the negative back-biasing voltage applied to the back-biasing target transistor. For example, each of the scan signal outputting circuits included in the scan driver 520 may apply the positive back-biasing voltage to the back-biasing target transistor when the turn-on voltage is applied to the back-biasing target transistor and may apply the negative back-biasing voltage to the back-biasing target transistor when the turn-off voltage is applied to the back-biasing target transistor.

As described above, the display device 500 may effectively prevent an off-current phenomenon of the oxide thin film transistors included in each of the scan signal outputting circuits by including the scan driver 520 that applies the negative back-biasing voltage to the back-biasing target transistor when the back-biasing target transistor is turned off in each of the scan signal outputting circuits and applies the positive back-biasing voltage to the back-biasing target transistor when the back-biasing target transistor is turned on in each of the scan signal outputting circuits. As a result, the display device 500 may secure a good operating margin and operating reliability. In addition, when the display device 500 further includes the emission driver 550, the emission driver 550 may have a structure that is substantially the same as a structure of the scan driver 520 (e.g., the gate driver) except that the emission driver 550 outputs the emission control signal ES instead of the scan signal GS.

Figure 13:
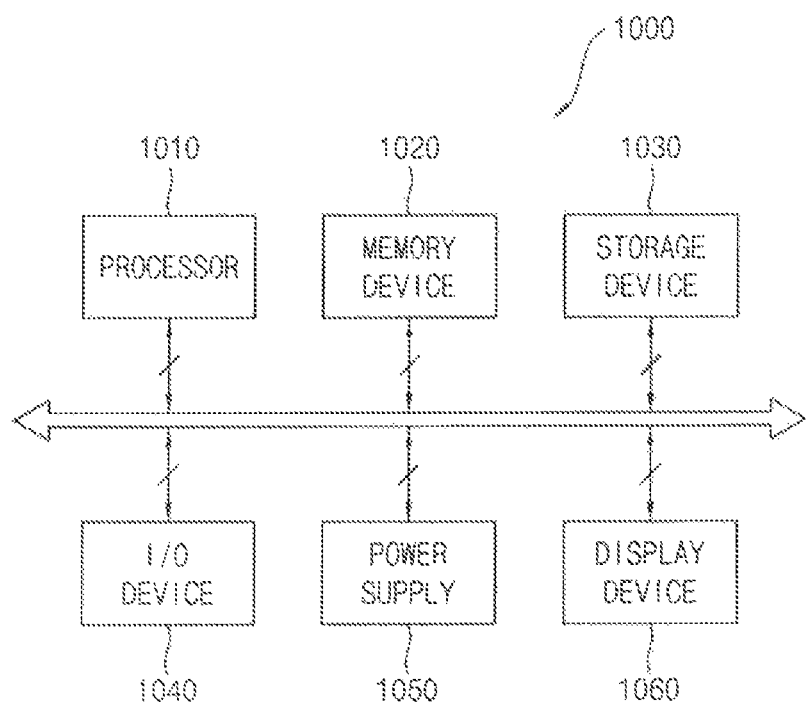
FIG. 13 is a block diagram illustrating an electronic device according to an exemplary embodiment of the present inventive concept.
Figure 14:
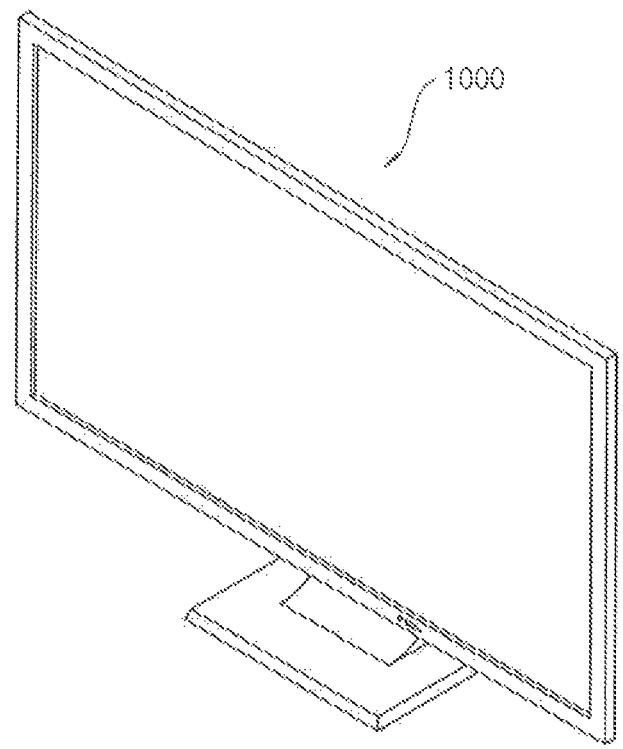
FIG. 14 is a diagram illustrating an example in which the electronic device of FIG. 13 is implemented as a television.
Figure 15:
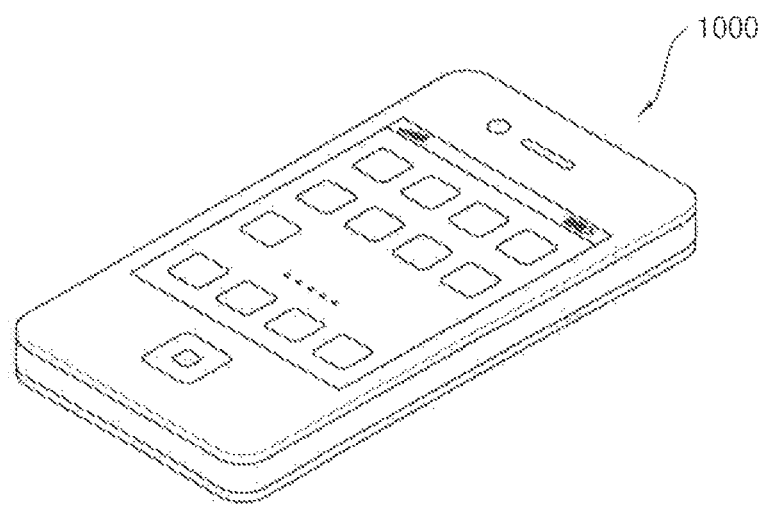
FIG. 15 is a diagram illustrating an example in which the electronic device of FIG. 13 is implemented as a smart phone.

FIG. 13 is a block diagram illustrating an electronic device according to an exemplary embodiment of the present inventive concept. FIG. 14 is a diagram illustrating an example in which the electronic device of FIG. 13 is implemented as a television. FIG. 15 is a diagram illustrating an example in which the electronic device of FIG. 13 is implemented as a smart phone.

Referring to FIGS. 13 through 15, an electronic device 1000 may include a processor 1010, a memory device 1020, a storage device 1030, an input/output (I/O) device 1040, a power supply 1050, and a display device 1060. Here, the display device 1060 may correspond to the display device 500 of FIG. 12. In addition, the electronic device 1000 may further include a plurality of ports for communicating with a video card, a sound card, a memory card, a universal serial bus (USB) device, other electronic devices, etc. In an exemplary embodiment of the present inventive concept, as illustrated in FIG. 14, the electronic device 1000 may be implemented as a television. In an exemplary embodiment of the present inventive concept, as illustrated in FIG. 15, the electronic device 1000 may be implemented as a smart phone. However, the electronic device 1000 is not limited thereto. For example, the electronic device 1000 may be implemented as a cellular phone, a video phone, a smart pad, a smart watch, a tablet personal computer (PC), a car navigation system, a computer monitor, a laptop, a head mounted display (HMD), etc.

The processor 1010 may perform various computing functions. The processor 1010 may be a micro processor, a central processing unit (CPU), an application processor (AP), etc. The processor 1010 may be coupled to other components via an address bus, a control bus, a data bus, etc. The bus may be denoted by the horizontal arrow in FIG. 13. Further, the processor 1010 may be coupled to an extended bus such as a peripheral component interconnection (PCI) bus. The memory device 1020 may store data for operations of the electronic device 1000.

For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 1030 may include a solid state drive (SSD) device, a hard disk drive (HDD) device, a compact disk read only memory (CD-ROM) device, etc.

The I/O device 1040 may include an input device such as a keyboard, a keypad, a mouse device, a touchpad, a touch-screen, etc. and an output device such as a printer, a speaker, etc. In an exemplary embodiment of the present inventive concept, the display device 1060 may be included in the I/O device 1040. The power supply 1050 may provide power for operations of the electronic device 1000. The display device 1060 may be coupled to other components via the buses or other communication links.

As described above, the display device 1060 may include a scan driver that can effectively prevent an off-current phenomenon of oxide thin film transistors included in respective scan signal outputting circuits by applying a back-biasing voltage to a back-biasing target transistor (e.g., the oxide thin film transistor) included in the respective scan signal outputting circuits. Here, the scan driver may apply a negative back-biasing voltage to the back-biasing target transistor when the back-biasing target transistor is turned off and may apply a positive back-biasing voltage to the back-biasing target transistor when the back-biasing target transistor is turned on. Thus, the display device 1060 may secure a good operating margin and operating reliability.

For example, the display device 1060 may include a display panel including a plurality of pixel circuits, a data driver that provides a data signal to the display panel via data-lines, a scan driver including the scan signal outputting circuits that provide a scan signal to the display panel via scan-lines, and a timing controller that controls the data driver and the scan driver. For example, the scan driver may be a gate driver that applies a gate signal to gate-lines included in the display panel. Here, each of the scan signal outputting circuits included in the scan driver may include a driving circuit and a buffer circuit. The driving circuit may include driving transistors and may provide a first driving signal and a second driving signal to a first driving node and a second driving node, respectively by turning on or off the driving transistors based on clock signals and a scan input signal corresponding to a scan start signal or a previous scan signal. The buffer circuit may include buffer transistors and may output the scan signal at an output node by turning on or off the buffer transistors based on the first driving signal and the second driving signal. Thus, each of the scan signal outputting circuits of the scan driver may perform a back-biasing voltage applying operation on the back-biasing target transistors of the driving transistors and the buffer transistors when the driving transistors and the buffer transistors are turned on or off. Since these features are described above, a duplicate description will not be repeated.

Exemplary embodiments of the present inventive concept may be applied to a display device and an electronic device including the display device. For example, the present inventive concept may be applied to a cellular phone, a smart phone, a video phone, a smart pad, a smart watch, a tablet PC, a car navigation system, a television, a computer monitor, a laptop, a head mounted display, etc.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A scan driver, comprising:
a plurality of scan signal outputting circuits,
wherein at least one of the scan signal outputting circuits includes:
a driving circuit including a plurality of driving transistors and configured to provide a first driving signal and a second driving signal to a first driving node and a second driving node, respectively by turning on or off the driving transistors in response to a plurality of clock signals and a scan input signal; and
a buffer circuit including a plurality of buffer transistors and configured to output a scan signal at an output node by turning on or off the buffer transistors in response to the first driving signal and the second driving signal,
wherein the at least one of the scan signal outputting circuits performs a back-biasing voltage applying operation on at least one of the driving transistors and the buffer transistors when the driving transistors and the buffer transistors are turned on or off,
wherein the at least one of the scan signal outputting circuits applies a positive back-biasing voltage to a back-biasing target transistor when a turn-on voltage is applied to the back-biasing target transistor and applies a negative back-biasing voltage to the back-biasing target transistor when a turn-off voltage is applied to the back-biasing target transistor,
wherein the at least one of the scan signal outputting circuits maintains a threshold voltage of the back-biasing target transistor when the back-biasing target transistor is turned on and increases the threshold voltage of the back-biasing target transistor when the back-biasing target transistor is turned off,
wherein the turn-on voltage corresponding to a logic high level of each of the clock signals is the same as the positive back-biasing voltage, and the turn-off voltage corresponding to a logic low level of each of the clock signals is higher than the negative back-biasing voltage,
wherein a bottom metal layer of a first buffer transistor is connected to a first terminal and a bottom metal layer of a second buffer transistor is connected to a second terminal different from the first terminal, and
wherein a signal applied to the first terminal alternates between first and second levels while a signal applied to the second terminal is maintained at the first level during a driving period.

2. The scan driver of claim 1, wherein the driving transistors and the buffer transistors are n-channel metal-oxide semiconductor (NMOS) oxide thin film transistors, and
wherein the back-biasing target transistor is a driving transistor or a buffer transistor to which the back biasing voltage applying operation is performed.

3. The scan driver of claim 1, wherein the scan signal is a gate signal that is applied to gate-lines included in a display panel.

4. The scan driver of claim 1, wherein the scan signal is an emission control signal that is applied to emission control-lines included in a display panel.

5. A scan driver, comprising:
a plurality of scan signal outputting circuits,
wherein at least one of the scan signal outputting circuits includes:
a driving circuit including a plurality of driving transistors and configured to provide a first driving signal and a second driving signal to a first driving node and a second driving node, respectively by turning on or off the driving transistors in response to a plurality of clock signals and a scan input signal; and
a buffer circuit including a plurality of buffer transistors and configured to output a scan signal at an output node by turning on or off the buffer transistors in response to the first driving signal and the second driving signal,
wherein the at least one of the scan signal outputting circuits performs a back-biasing voltage applying operation on at least one of the driving transistors and the buffer transistors when the driving transistors and the buffer transistors are turned on or off, and
wherein the at least one of the scan signal outputting circuits applies a positive back-biasing voltage to a back-biasing target transistor when a turn-on voltage is applied to the back-biasing target transistor and applies a negative back-biasing voltage to the back-biasing target transistor when a turn-off voltage is applied to the back-biasing target transistor,
wherein the at least one of the scan signal outputting circuits decreases a threshold voltage of the back-biasing target transistor when the back-biasing target transistor is turned on and increases the threshold voltage of the back-biasing target transistor when the back-biasing target transistor is turned off,
wherein the turn-on voltage corresponding to a logic high level of each of the clock signals is lower than the positive back-biasing voltage, and the turn-off voltage corresponding to a logic low level of each of the clock signals is higher than the negative back-biasing voltage,
wherein a bottom metal layer of a first buffer transistor is connected to a first terminal and a bottom metal layer of a second buffer transistor is connected to a second terminal different from the first terminal, and
wherein a signal applied to the first terminal alternates between first and second levels while a signal applied to the second terminal is maintained at the first level during a driving period.

6. The scan driver of claim 5, wherein the driving transistors and the buffer transistors are n-channel metal-oxide semiconductor (NMOS) oxide thin film transistors, and
wherein the back-biasing target transistor is a driving transistor or a buffer transistor to which the back biasing voltage applying operation is performed.

7. A display device, comprising:
a display panel including a plurality of pixel circuits;
a data driver configured to provide data signals to the display panel via a plurality of data-lines;
a scan driver including a plurality of scan signal outputting circuits that provide scan signals to the display panel via a plurality of scan-lines; and
a timing controller configured to control the data driver and the scan driver,
wherein at least one of the scan signal outputting circuits includes:
a driving circuit including a plurality of driving transistors and configured to provide a first driving signal and a second driving signal to a first driving node and a second driving node, respectively by turning on or off the driving transistors in response to a plurality of clock signals and a scan input signal; and
a buffer circuit including a plurality of buffer transistors and configured to output the scan signal at an output node by turning on or off the buffer transistors in response to the first driving signal and the second driving signal,
wherein the at least one of the scan signal outputting circuits performs a back-biasing voltage applying operation on at least one of the driving transistors and the buffer transistors when the driving transistors and the buffer transistors are turned on or off,
wherein the at least one of the scan signal outputting circuits applies a positive back-biasing voltage to a back-biasing target transistor when a turn-on voltage is applied to the back-biasing target transistor and applies a negative back-biasing voltage to the back-biasing target transistor when a turn-off voltage is applied to the back-biasing target transistor,
wherein the at least one of the scan signal outputting circuits maintains a threshold voltage of the back-biasing target transistor when the back-biasing target transistor is turned on and increases the threshold voltage of the back-biasing target transistor when the back-biasing target transistor is turned off,
wherein the turn-on voltage corresponding to a logic high level of each of the clock signals is the same as the positive back-biasing voltage, and the turn-off voltage corresponding to a logic low level of each of the clock signals is higher than the negative back-biasing voltage,
wherein a bottom metal layer of a first buffer transistor is connected to a first terminal and a bottom metal layer of a second buffer transistor is connected to a second terminal different from the first terminal, and
wherein a signal applied to the first terminal alternates between first and second levels while a signal applied to the second terminal is maintained at the first level during a driving period.

8. The display device of claim 7, wherein the driving transistors and the buffer transistors are n-channel metal-oxide semiconductor (NMOS) oxide thin film transistors, and
wherein the back-biasing target transistor is a driving transistor or a buffer transistor to which the back biasing voltage applying operation is performed.

9. The display device of claim 7, wherein the scan input signal corresponds to a scan start signal or a previous scan signal.

10. A display device, comprising:
a display panel including a plurality of pixel circuits;
a data driver configured to provide data signals to the display panel via a plurality of data-lines;
a scan driver including a plurality of scan signal outputting circuits that provide scan signals to the display panel via a plurality of scan-lines; and
a timing controller configured to control the data driver and the scan driver,
wherein at least one of the scan signal outputting circuits includes:
a driving circuit including a plurality of driving transistors and configured to provide a first driving signal and a second driving signal to a first driving node and a second driving node, respectively by turning on or off the driving transistors in response to a plurality of clock signals and a scan input signal; and
a buffer circuit including a plurality of buffer transistors and configured to output the scan signal at an output node by turning on or off the buffer transistors in response to the first driving signal and the second driving signal,
wherein the at least one of the scan signal outputting circuits performs a back-biasing voltage applying operation on at least one of the driving transistors and the buffer transistors when the driving transistors and the buffer transistors are turned on or off, and
wherein the at least one of the scan signal outputting circuits applies a positive back-biasing voltage to a back-biasing target transistor when a turn-on voltage is applied to the back-biasing target transistor and applies a negative back-biasing voltage to the back-biasing target transistor when a turn-off voltage is applied to the back-biasing target transistor,
wherein the at least one of the scan signal outputting circuits decreases a threshold voltage of the back-biasing target transistor when the back-biasing target transistor is turned on and increases the threshold voltage of the back-biasing target transistor when the back-biasing target transistor is turned off,
wherein the turn-on voltage corresponding to a logic high level of each of the clock signals is lower than the positive back-biasing voltage, and the turn-off voltage corresponding to a logic low level of each of the clock signals is higher than the negative back-biasing voltage,
wherein a bottom layer of a first buffer transistor is connected to a first terminal and a bottom metal layer of a second buffer transistor is connected to a second terminal different from the first terminal, and
wherein a signal applied to the first terminal alternates between first and second levels while a signal applied to the second terminal is maintained at the first levels during a driving period.

11. The display device of claim 10, wherein the driving transistors and the buffer transistors are n-channel metal-oxide semiconductor (NMOS) oxide thin film transistors, and
wherein the back-biasing target transistor is a driving transistor or a buffer transistor to which the back biasing voltage applying operation is performed.

* * * * *